June 19, 1951 H. F. RIETH 2,557,234

ULTRA HIGH FREQUENCY TUNING APPARATUS

Filed May 19, 1949 3 Sheets-Sheet 1

Inventor
HAROLD F. RIETH by The Firm of Charles W. Hills Attys.

June 19, 1951 H. F. RIETH 2,557,234
ULTRA HIGH FREQUENCY TUNING APPARATUS
Filed May 19, 1949 3 Sheets-Sheet 2
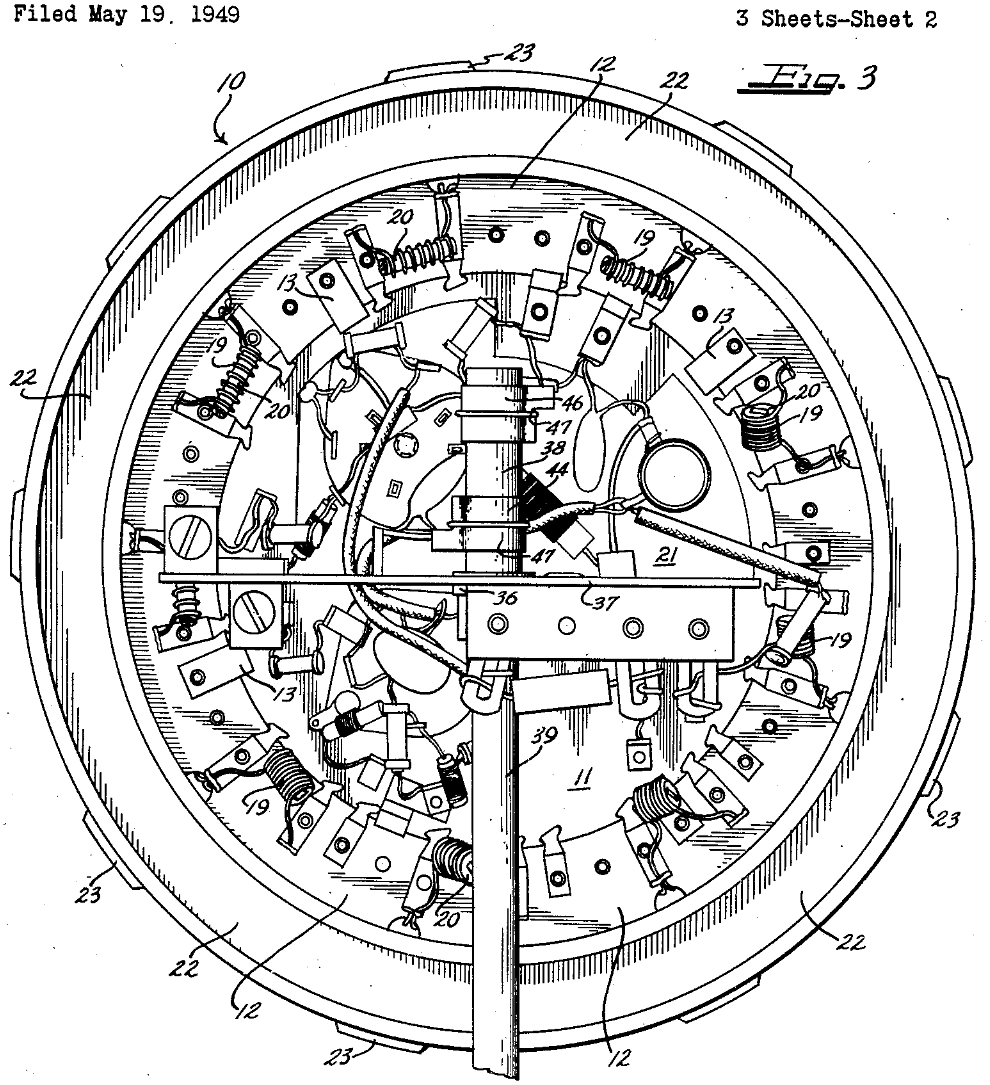
FIG. 4
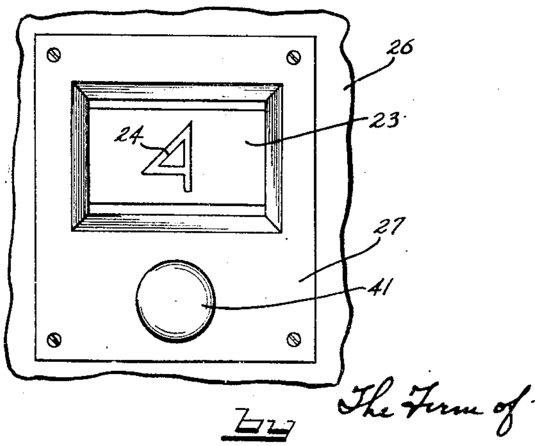
FIG. 5
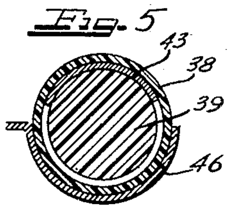
Inventor
HAROLD F. RIETH
by The Firm of Charles W. Hills Attys.

June 19, 1951 H. F. RIETH 2,557,234

ULTRA HIGH FREQUENCY TUNING APPARATUS

Filed May 19, 1949 3 Sheets-Sheet 3

Inventor
HAROLD F. RIETH by The Firm of Charles W. Hills Attys

UNITED STATES PATENT OFFICE 2,557,234

ULTRA HIGH FREQUENCY TUNING APPARATUS

Harold F. Rieth, Kokomo, Ind., assignor to Kingston Products Corporation, Kokomo, Ind., a corporation of Indiana Application May 19, 1949, Serial No. 94,103

10 Claims. (Cl. 250—40)

This invention relates generally to ultra high frequency tuning apparatus and more particularly to a television tuner.

It is well known that second only to obtaining a picture of high quality, the aim of contemporary television engineers is to obtain simplicity whereby the controls required are few in number and simple to operate, and the construction of the equipment provided is rugged, permanent, compact and truly satisfactory for use in homes of the observing public.

Heretofore, ultra high frequency tuning apparatus has been characterized by structural complexities which have been seriously deficient insofar as cost of production, convenience of operation and durability has been concerned.

It is therefore an object of this invention to provide a television tuner which may be economically and conveniently produced through the employment of a reduced number of simplified elements which may be fabricated by production line methods through the elimination of unnecessary sub-assemblies and expensive soldering and inspection operations.

It is also an object of this invention to provide a television tuner which is unusually compact but which may be produced by relatively inexperienced personnel due to the complete visibility of all component elements and the accessibility of all vital parts.

A further object of this invention is to provide a method of operating an ultra high frequency tuning apparatus which lends itself to advantageous indexing through improved dial calibration and mechanical ease of operation.

A further object of this invention is to provide a television tuner whereby the physical relationship of the required components eliminates circulating ground currents and reduces deleterious regeneration and degeneration effects.

Yet another object of this invention is to provide a television tuner whereby the harmful effects of oscillator currents may be minimized.

Another object of the present invention is to provide an ultra high frequency tuning apparatus which is easy to service.

A further object of this invention is to provide an ultra high frequency tuner apparatus which permits the employment of unusually short circuit leads.

According to the general features of the present invention an ultra high frequency tuning apparatus is provided comprising one or more horizontally disposed wafers of insulating material upon which may be mounted the conventional input circuit components which are employed in common with all frequency channels. A circling ring of insulating material is annularly disposed relative to the wafers and carries pre-tuned circuit means which are necessary to accept predetermined frequencies of individual channels. The circuit means on the ring and on the wafer may be selectively connected for automatic tuning by means of slide switch contacts engageable with one another upon predetermined relative rotation. Indexing means may be provided for the circling ring. The tuning apparatus thus provided may be adapted for substantially any conventional type of dial treatment as may be necessary for station selection.

It is believed that the methods of operation contemplated by the present invention will become manifest and will be most clearly understood from the description of the apparatus provided for practicing same.

Many other features, advantages and objects of the present invention as well as the specific nature thereof will become evident upon making reference to the detailed description which follows and the accompanying sheets of drawings in which:

On the drawings:

Figure 3 is a bottom plan view of the tuning apparatus shown in Figure 1;

Figure 4 is a fragmentary enlarged elevational view of a dial indication device illustrating how the tuning apparatus of Figure 1 may be adapted for thumb wheel station selection;

Figure 5 is an enlarged cross sectional view taken on line V—V of Figure 2.

The principles of my invention are herein applied to a superheterodyne type receiver wherein an incoming modulated wave, whatever its carrier frequency, is combined with the wave from an oscillator of such frequency that the useful resultant wave has a given frequency, usually termed an intermediate frequency, within relatively narrow limits. In this manner, the use of fixed tuned circuits in the intermediate frequency amplifier is permitted and the receiver system may thus be made to yield improved selectivity, sensitivity and fidelity.

Figures 1, 2:
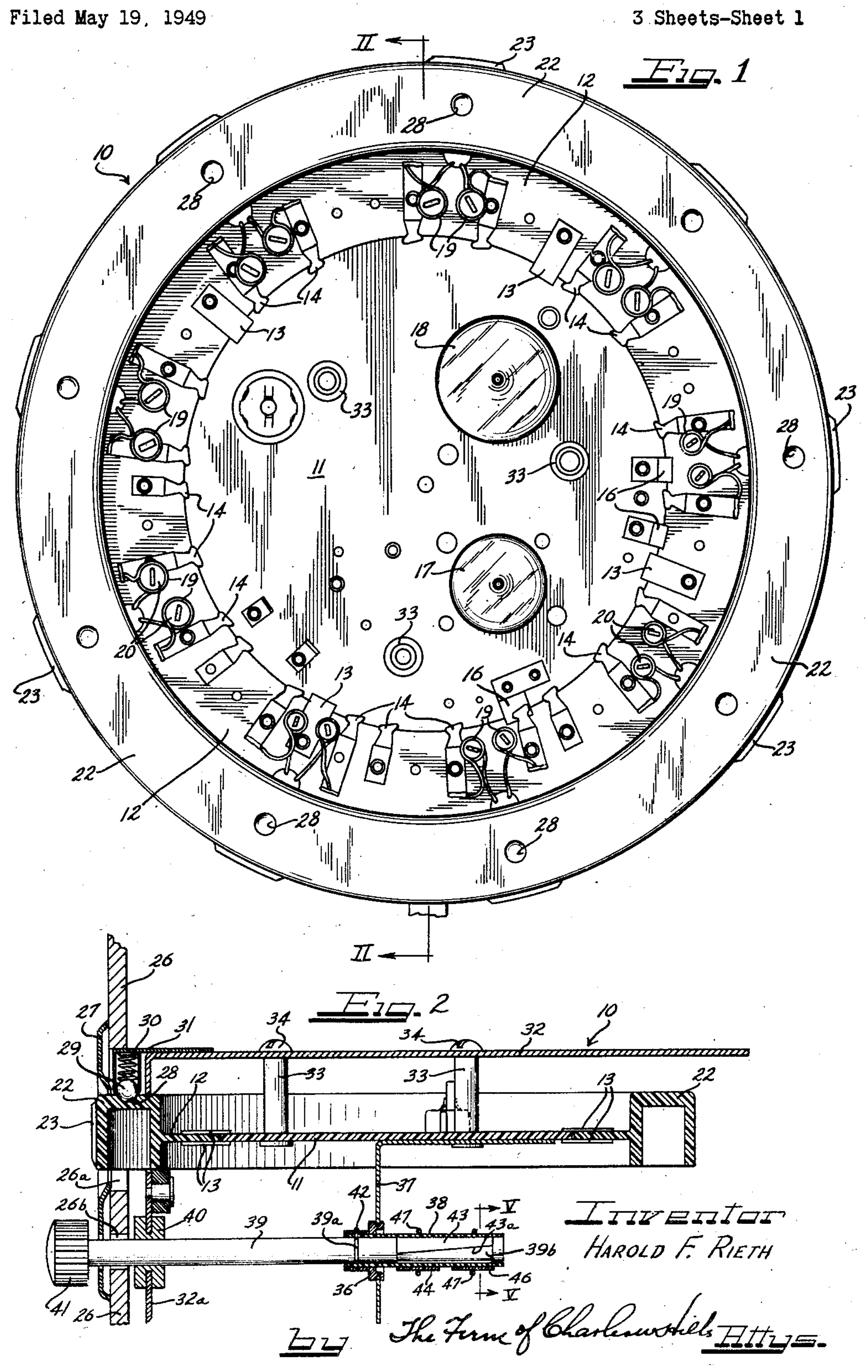
Figure 1 is an enlarged plan view of an ultra-high frequency tuning apparatus, with parts removed, embodying the principles of the present invention.
Figure 2 is a cross sectional view in side elevation taken on line II—II of Figure 1 with circuit components removed for the sake of clarity.

As shown on Figures 1, 2 and 3, an ultra high frequency tuning apparatus is indicated generally by the reference numeral 10 and is preferably built so as to be disposed entirely in a horizontal plane. The horizontal plane is fundamentally established by one or more wafers of insulating material 11 which may take a disk-like circular form. As embodied in the preferred structure herein shown, a ring of insulating material 12 may be annularly disposed relative to the wafer 11 and may be arranged for adjustable angular rotation relative thereto by means of retainers or lugs 13 which may be radially spaced and fastened in opposing relationship to one another upon the ring 12 in such a manner as to retain the ring 12 and the wafer 11 in sliding assembly.

The center section defined by the wafer 11 provides ample space upon which to mount the necessary radio tubes and associated circuit components which are common to all ultra high frequency receiving apparatus.

The ring 12 provides an ample mounting space for coils or other pre-tuned circuit components which are necessary for individual frequency channels.

A plurality of female contacts 14 may be provided on the ring 12 and a plurality of male contacts 16 may be provided on the wafer 11 so that the circuit means carried by the ring 12 and the wafer 11 may be electrically connected in accordance with the principles of conventional slide switch practice.

Those versed in the radio art will readily appreciate that frequency conversion is used in superheterodyne type receivers to change the frequency of an R. F. (radio frequency) signal to an I. F. (intermediate frequency) signal. To effect this change in frequency, a frequency-conventing device consisting of an oscillator and a frequency mixer may be employed.

In such a device, two voltages of different frequency, the R. F. signal voltage and the voltage generated by the oscillator, are applied to the input of the frequency mixer. These voltages beat, or heterodyne, within the mixer tube to produce a plate current having, in addition to the frequencies of the input voltages, numerous and different frequencies.

The output circuit of the mixer stage is provided with a tuned circuit which is adjusted to select only one beat frequency, i. e., the frequency equal to the difference between the signal frequency and the oscillator frequency. The selected output frequency is known as the intermediate frequency, or I. F. The output frequency of the mixer tube is kept constant for all values of signal frequency by tuning the oscillator to the proper frequency.

Thus, it will be appreciated that certain components of the frequency conversion circuit means may be used in common when receiving specific station or channel signals selected from the overall frequency spectrum. Although varius methods of frequency conversion for superheterodyne receivers are commonly practiced, the present embodiment shown by way of illustrative example employs a number of input circuit components arranged on the center section defined by the wafer 11 which include a detector or R. F. amplifier tube 17 and a local oscillator or electron tube 18.

Frequency selector means in the form of a plurality of pre-tuned inductance coils 19 are shown mounted on the circling ring 12.

Structural adaptations and the usage of nomenclature in the radio art vary widely, however, it will be recognized that the tuning apparatus 10 herein described is characterized by the unique physical arrangement of the required components whereby a simple rotary mechanical movement permits the combination of several tuning functions into a single switching action.

In any event, it will be evident that the physical arrangement contemplated by the present invention permits the radially spaced disposition of pre-tuned circuit means for frequency selection purposes on the ring 12 annularly disposed relative to the conventional frequency conversion components, variously identified in the literature as a first detector and oscillator or as mixers and converters, or sometimes as a "converter mixer," or again, generic reference is sometimes made to input circuit means.

A particular feature flowing from and residing in the physical arrangement herein exemplified, is the radial spacing of the tuned secondaries, sometimes referred to as tuned circuit means and shown in the form of the coils 19. The radial spacing of the coils 19 permits easy alignment because of the improved accessibility of all the coils. Furthermore, inductance variations may be readily accomplished by rotatively adjusting suitable powdered iron or brass plugs 20 in the coils 19.

By coupling the tuned circuit means with the input circuit means through slide switch contacts 14 and 16, unusually short circuit leads may be employed. This feature follows from the unique spacing arrangement since the various components may be spread out and connected directly to appropriate circuit leads instead of to long cross-overs or common grounds as has heretofore been necessary.

In this connection, it will be noted on Figure 3 that the components of the input circuit means of the center section defined by the wafer 11 may be conveniently grounded to a ground plate 21 through correspondingly short ground leads.

Thus, the present tuning apparatus 10 eliminates circulating ground currents through the tuner which in turn reduces the harmful effects of regeneration and degeneration.

It will also be apparent that the tuner structure herein described permits the antenna coil, the oscillator coil and the R. F. coil to be widely spaced from one another which feature is highly desirable, of course, since such spacing reduces the harmful effects of regeneration and oscillator radiation.

The fabrication and production of the tuner apparatus 10 is also greatly facilitated by virtue of the fact that the generally horizontal disposition of the various components eliminates all subassemblies and permits the practice of production line methods because all soldering operations may be performed at once and unnecessary inspection procedures are eliminated.

Making particular reference to Figure 2, it will be noted that the embodiment thereof shows the tuning apparatus 10 adapted for thumb wheel dial treatment. To effect such adaptation, the ring 12 may be made integral with a thumb wheel 22, as for example, by making the thumb wheel 22 and the ring 12 as an integral plastic molding.

The thumb wheel 22 may be provided with a plurality of radially spaced bosses 23 on its outer periphery suitably embellished with numerals or other station or channel designations 24 (Figure 4).

The thumb wheel 22 may be arranged in such a manner as to project outwardly through an aperture 26a defined by a cabinet front 26 of a cabinet housing the tuning apparatus 10 and an associated television set. A fascia element 27 may be mounted on the cabinet front 26 so as to blend in with the general decorative effect to be achieved in the vicinity of the aperture 26a.

The upper face of the thumb wheel 22 may be provided with a plurality of suitable indentations 28 for receiving a ball 29 in detent seating relationship. The ball 29 may be resiliently biased by appropriate means such as a spring 30. The ball 29 and the spring 30 may be housed in an indexing frame 31.

In order to effect mounting of the tuning apparatus 10 in the chassis of a television set, a sheet metal frame 32 may be provided which is positioned in spaced relationship with the wafer 11 by a plurality of suitably arranged supports 33 made integral with the wafer 11 and adapted to threadedly receive fastening screws 34 passed through the frame 32.

Figures 6, 7:
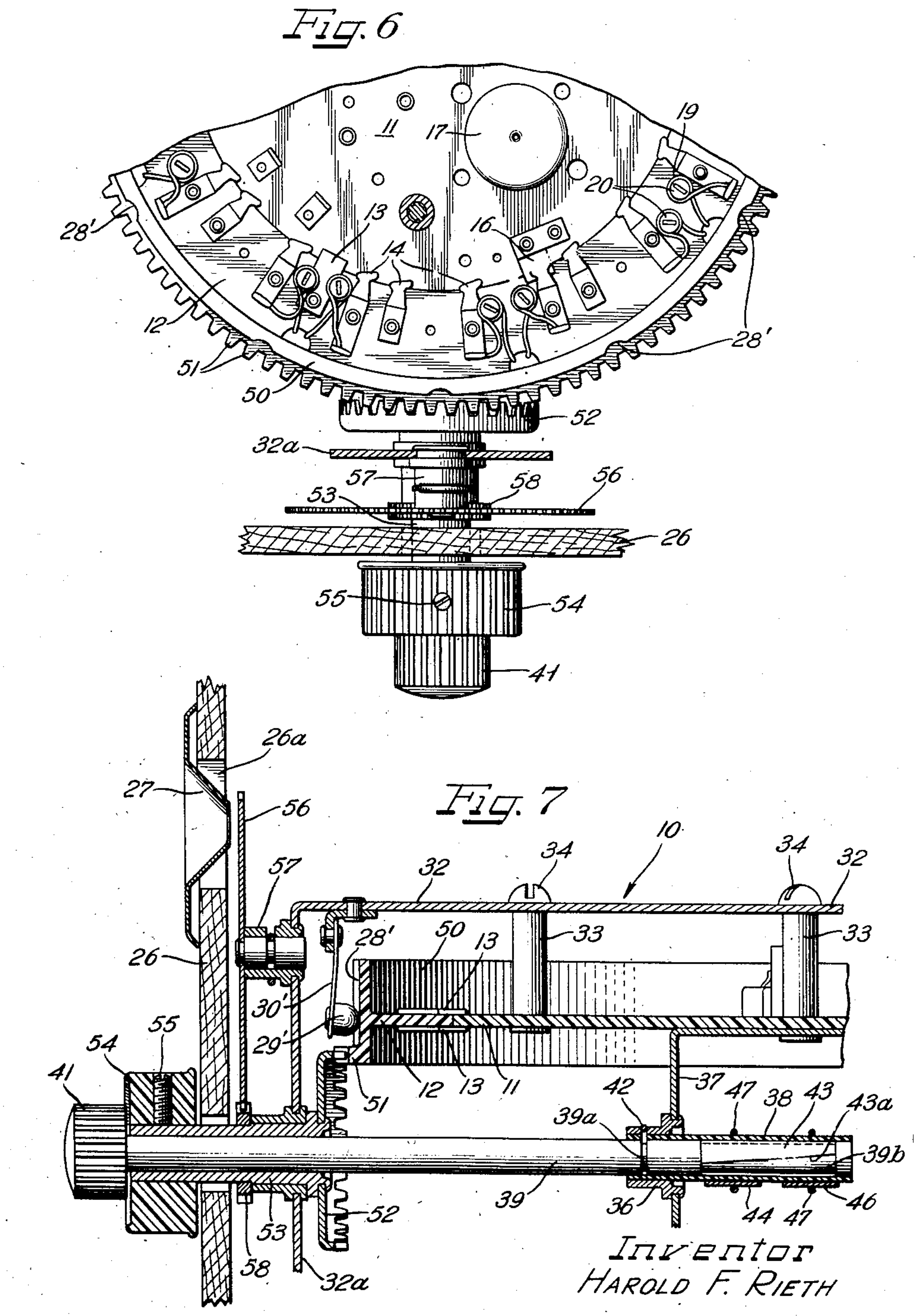
Figure 6 is a fragmentary enlarged plan view of a dial indication device illustrating how the tuning apparatus of Figure 1 may be adapted for dial knob station selection.
Figure 7 is a cross-sectional view in side elevation of the device shown in Figure 6 with circuit components removed for the sake of clarity.

If it is desired to adapt the tuning apparatus 10 for rotation by a conventional dial knob, it will be understood that such type of dial treatment may be readily effected, for example, as shown in Figures 6 and 7, a suitable flange 50 may be made integral with the ring 12, the flange 50 defining a ring gear portion 51 to mesh with a crown gear 52 affixed to a hollow shaft 53 journaling the shaft of a fine trimming mechanism to be hereinafter described.

A knob 54 may be affixed to the hollow shaft 53 by a set screw 55 to permit selective rotation of the tuning apparatus.

It will be readily understood that the cabinet front 26 may be adapted for dial knob treatment by the provision of an aperture 26a′ having a fascia element 27′ therein in registry with a gear-type dial scale 56 rotatably mounted as at 57 and having a driven connection with the shaft 53 through a gear 58 carried thereon.

The flange 50 may be provided with a plurality of suitable indentations 28′ for receiving a ball-like element 29′ carried on the end of a resilient arm 30′ which, in turn, is mounted on the frame 32. Although the present invention contemplates the provision of other types of dial treatment in order to effect rotation of the ring 12, further description of such structures is felt to be unnecessary since many mechanisms are well known to those versed in the art and could be readily applied to the present tuning apparatus 10.

The tuning apparatus 10 may be provided with a trimmer or fine trimming mechanism which may most clearly be seen on Figures 2, 3, 5 and 7. A bushing 36 carried by a depending frame element 37 made integral with the wafer 11 receives a cylinder of insulating material 38 which, in turn, journals a shaft 39 also made of suitable insulating material.

The shaft 39 extends outwardly through a bushing 40 carried by a depending frame element 32a and projects through an aperture 26b formed in the cabinet front 26. A knurled knob 41 may be affixed to the free end of the shaft 39 to facilitate rotative manipulation thereof.

The shaft 39 may be provided with a peripheral groove 39a lockingly engageable with a snap spring 42 carried by the bushing 36. The shaft 39 is further provided with a recessed portion 39b adapted to receive a metal segment 43 in firm assembly therewith. The metal segment 43 may be conveniently formed from a substantially rectangular flat piece of metal and rolled to assume the circumferential contour of the shaft 39 at the recessed portion 39b. The segment 43 preferably has its longitudinal edges skived as at 43a to increase the sensitivity of the trimmer. A pair of metal condenser elements 44 and 46 are mounted on the cylinder of insulating material 38 in predetermined spaced relationship by means of suitable fasteners 47.

It will be apparent that the condenser elements 44 and 46 may be incorporated into the input circuit means of the tuning apparatus 10 and are capacity connected by means of the segment 43 as the shaft 39 is rotated within the cylinder of insulating material 38. It will also be apparent that a trimmer so constructed completely eliminates wiping contact between the condenser and segment elements and permits an especially sensitive adjustment of capacity when the segment 43 is variably positioned relative to the condenser elements 44 and 46.

It will be apparent that I have described an ultra-high frequency tuning apparatus characterized by a unique physical arrangement of components which results in many features and advantages, the utilization of which have been heretofore precluded.

It should be understood, of course, that a person skilled in the art could conceivably make various minor modifications to the structure herein shown and described which would not mark a departure from the substantial spirit and scope of my contribution to the art. Accordingly, I do not wish to be limited to the specific details herein described for the sake of clarity only.

I claim as my invention:

1. An ultra high frequency tuning apparatus comprising in combination, a wafer of insulating material, input circuit means carried thereby, a circling ring of insulating material annularly disposed relative to said wafer, tuned circuit means carried thereby and means providing slide switch contacts between said circuit means whereby said tuned circuit means may be selectively connected to said input circuit means.

2. An ultra high frequency tuning apparatus comprising, in combination, at least one wafer of insulating material, mixer converter circuit means carried thereby, a circling ring of insulating material annularly disposed relative to said wafer, pre-tuned circuit means carried thereby, slide switch contacts between both of said circuit means for selective electrical connection therebetween and means to rotate said ring, said means including a thumb wheel connected to said circling ring and an indexing mechanism cooperable with said thumb wheel to selectively lock said circling ring in predetermined contact position.

3. A tuning apparatus comprising, in combination, a generally circular support element, input circuit means carried thereby, an annulus circling the support element and rotatably mounted relative thereto, resonating circuit means carried thereby and contact means between the annulus and the support element to selectively connect the resonating circuit means with the input circuit means upon relative angular movement between the annulus and the support element.

4. A tuning apparatus comprising, in combination, a generally circular support element, input circuit means carried thereby, an annulus circling the support element, pre-tuned circuit means carried thereby, contact means between the annulus and the support element to selectively connect the pre-tuned circuit means with the input circuit means, and means to selectively rotate the annulus for effecting automatic tuning.

5. A tuning apparatus comprising, in combination, a generally circular support element, input circuit means carried thereby, an annulus circling the support element, pre-tuned circuit means carried thereby, contact means between the annulus and the support element to selectively connect the pre-tuned circuit means with the input circuit means, and means to selectively rotate the annulus for effecting automatic tuning including a rotatable dial knob having a driven connection with the annulus.

6. A tuning apparatus comprising, in combination, a generally circular support element, input circuit means carried thereby, an annulus circling the support element, pre-tuned circuit means carried thereby, contact means between the annulus and support element to selectively connect the pre-tuned circuit means with the input circuit means, and means to selectively rotate the annulus for effecting automatic tuning, said means including a rotatable dial knob, a driver gear connected therewith and a driven gear connected with the annulus, both of said gears being in intermeshing relationship with one another.

7. A tuning apparatus comprising, in combination, a generally circular support element, input circuit means carried thereby, an annulus circling the support element, pre-tuned circuit means carried thereby, contact means between the annulus and the support element to selectively connect the pre-tuned means with the input circuit means, and means to selectively rotate the annulus including a rotatable dial knob having a driven connection with the annulus, said annulus rotating means further including indexing means cooperable with the annulus to selectively and yieldably lock the annulus in pre-determined contact position.

8. A frequency selective tuning apparatus comprising tuning circuit means arranged on a predisposed plane, a plurality of pretuned resonating circuit means in radially spaced alignment on the same plane as and concentric with respect to said tuning circuit means, mounting means supporting said pre-tuned resonating circuit means and said tuning circuit means for relative angular displacement, and electrical connection means to alternatively connect selected units of said pre-tuned resonating circuit means to said tuning circuit means as relative angular displacement occurs.

9. A tuning apparatus as defined in claim 8, and means to relatively rotate said resonating circuit means and said tuning circuit means.

10. A tuning apparatus as defined in claim 8 and means to relatively rotate said resonating circuit means and said tuning circuit means, including indexing means to retain both of said circuit means in predetermined angular positions.

HAROLD F. RIETH.

REFERENCES CITED

The following references are of record in the file of this patent:

UNITED STATES PATENTS

| Number | Name | Date |
|---|---|---|
| 1,707,948 | Elliott | Apr. 2, 1929 |
| 2,103,035 | Lear | Dec. 21, 1937 |
| 2,219,003 | Braunschweig et al. | Oct. 22, 1940 |
| 2,253,978 | Meriwether | Aug. 26, 1941 |
| 2,273,531 | Kreienfeld | Feb. 17, 1942 |
| 2,430,886 | Peterson | Nov. 18, 1947 |